(12) United States Patent
Kim et al.

(10) Patent No.: US 6,355,516 B1
(45) Date of Patent: Mar. 12, 2002

(54) METHOD OF MANUFACTURING A CAPACITOR WITH A BI-LAYER $TA_2O_5$ CAPACITOR DIELECTRIC IN A SEMICONDUCTOR DEVICE INCLUDING PERFORMING A PLASMA TREATMENT ON THE FIRST $TA_2O_5$ LAYER

(75) Inventors: You Sung Kim, Seoul; Kyong Min Kim, Kyungki-Do; Chang Seo Park, Kyungki-Do; Han Sang Song, Kyungki-Do; Ki Seon Park, Kyungki-Do; Chan Lim, Kyungki-Do, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/606,411

(22) Filed: Jun. 29, 2000

(30) Foreign Application Priority Data

Jun. 29, 1999 (KR) .............................................. 99-25464

(51) Int. Cl.[7] .......................................... H01L 21/8242
(52) U.S. Cl. ........................ 438/240; 438/3; 438/253; 438/393; 438/396; 438/785; 438/957
(58) Field of Search ........................... 438/3, 240, 393, 438/653, 656, 785, 957, 253, 396, 474

(56) References Cited

U.S. PATENT DOCUMENTS

| | | | |
|---|---|---|---|
| 5,187,557 A | * | 2/1993 | Zenke ............................ 257/310 |
| 5,189,503 A | * | 2/1993 | Suguro et al. ................. 257/310 |
| 5,837,593 A | * | 11/1998 | Park et al. .................... 438/396 |
| 6,218,300 B1 | * | 4/2001 | Narwankar et al. ......... 438/685 |
| 6,265,260 B1 | * | 7/2001 | Alers et al. .................. 438/240 |

OTHER PUBLICATIONS

Alers et al, Appl. Phys. Lett., vol. 72, No. 11, Mar. 16, 1998.*

* cited by examiner

*Primary Examiner*—Caridad Everhart
*Assistant Examiner*—Craig P. Lytle
(74) *Attorney, Agent, or Firm*—Pennie & Edmonds LLP

(57) ABSTRACT

There is disclosed a method of manufacturing a capacitor in a semiconductor device capable of effectively removing the organic impurity of a $Ta_2O_5$ film by performing an in-situ plasma process using the mixture gas of nitrogen and oxygen during the process of forming the $Ta_2O_5$ film as the dielectric film of the capacitor. Thus, it can reduce the impurity of the $Ta_2O_5$ film to increase the supply of oxygen, and thus can improve the dielectric and leak current characteristic of the $Ta_2O_5$ film. Further, it can prohibit oxidization of the underlying electrode, thus reducing the thickness of the equivalent oxide film of the capacitor as possible and sufficiently securing the capacitance of the capacitor. The method according to the present invention includes forming a polysilicon film on a semiconductor substrate in which a given underlying structure is formed; sequentially forming a first buffer layer and a metal layer on the polysilicon film to form a lower electrode; forming a $Ta_2O_5$ film on the metal layer, wherein the process of depositing the $Ta_2O_5$ film is performed by a plasma process under the mixture gas atmosphere of nitrogen and oxygen; and forming a second buffer layer and an upper electrode on the $Ta_2O_5$ film.

17 Claims, 2 Drawing Sheets

METHOD OF MANUFACTURING A CAPACITOR WITH A BI-LAYER TA$_2$O$_5$ CAPACITOR DIELECTRIC IN A SEMICONDUCTOR DEVICE INCLUDING PERFORMING A PLASMA TREATMENT ON THE FIRST TA$_2$O$_5$ LAYER

BACKGROUND OF THE INVENTION

1. Field of the Invention:

The present invention relates generally to a method of manufacturing a capacitor in a semiconductor device. More particularly, the present invention relates to a method of manufacturing a capacitor in a semiconductor device capable of improving the characteristic of a Ta$_2$O$_5$ film, by performing a plasma process in in-situ under the mixture gas atmosphere of nitrogen and oxygen during deposition of CVD Ta$_2$O$_5$ film used as a dielectric film of a capacitor.

2. Description of the Prior Arts:

A tantalum oxide film (Ta$_2$O$_5$) is higher 5 times in the dielectric constant than the ONO film (Oxide-Nitride-Oxide) used as a dielectric film of a capacitor in the process of manufacturing the existing DRAM. Thus, it has been widely attracted as dielectric materials of a capacitor in the process of manufacturing a DRAM that requires the integration degree of more than 1Giga byte. In particular, Ta$_2$O$_5$ can represent the high step coverage by CVD process. Also, it can be implemented as a small film having a good dielectric characteristic and a less leak current by a subsequent annealing process.

It has been reported that the cell capacitance of the capacitor, which uses the Ta$_2$O$_5$ film having a MIS (Metal-Insulator-Semiconductor) structure as a dielectric film, is more than 3fF since the underlying polysilicon plug was crowded, and also the cell leak current of the capacitor is less than 1fF.

In order to improve the integration degree, focus has been centered to developing a capacitor that uses as a dielectric film the Ta$_2$O$_5$ film of a MIM (Metal-Insulator-Metal) structure using a metal layer as a lower electrode. The reason is that, if the Ta$_2$O$_5$ film is formed on the metal electrode, the crystallization of the Ta$_2$O$_5$ film can be improved to increase its dielectric constant, and also the leak current of the Ta$_2$O$_5$ film is advantageous since the work function of the metal layer is high.

The CVD Ta$_2$O$_5$ film may include organic impurities and are amorphous. Thus, it cannot be used intact without improving the quality of the film by a subsequent process. The subsequent process for improving the quality of the film may include a low temperature process and a high temperature process. Then, the low temperature uses a plasma process for removing an organic source within the Ta$_2$O$_5$ film under oxidization atmosphere and a UV/O$_3$ process. The high temperature uses a rapid annealing process for improving crystallization of the thin film etc. When processing the MIM Ta$_2$O$_5$ film, if the process temperature is increased under oxidization atmosphere, a metal oxide may be formed at the interface of the lower metal electrode and the Ta$_2$O$_5$ film. Thus metal oxide may increase the equivalent oxide thickness to decrease the amount of charging charges. Thereby, as the sufficient amount of charging charges cannot be obtained at the operating voltage within the unit cell, it may not be used as a capacitor to storing data.

SUMMARY OF THE INVENTION

It is therefore an object of the present invention to provide a method of manufacturing a capacitor in a semiconductor device capable of improving the characteristic of a Ta$_2$O$_5$ film while prohibiting forming an oxide film of the lower electrode.

In order to accomplish the above object, the method of manufacturing a capacitor in a semiconductor device according to the present invention is characterized in that it comprises the steps of forming a polysilicon film on a semiconductor substrate in which a given underlying structure is formed; sequentially forming a first buffer layer and a metal layer on the polysilicon film to form a lower electrode; forming a Ta$_2$O$_5$ film on the metal layer, wherein the process of depositing the Ta$_2$O$_5$ film is performed by a plasma process under the mixture gas atmosphere of nitrogen and oxygen; and forming a second buffer layer and an upper electrode on the Ta$_2$O$_5$ film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
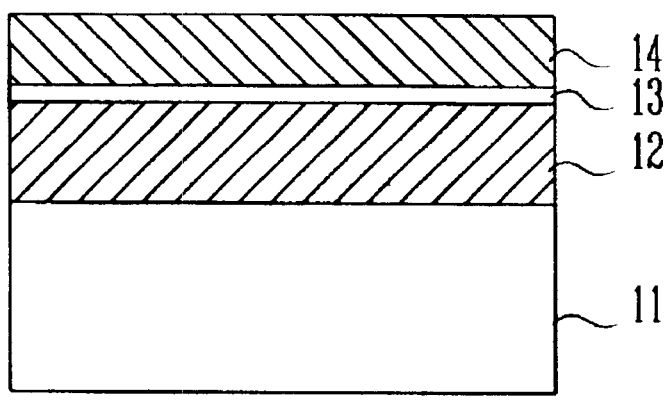
FIGS. 1A through 1C are sectional views of a device for illustrating a method of manufacturing a capacitor in a semiconductor device according to the present invention.

The present invention will be described in detail by way of a preferred embodiment with reference to accompanying drawings, in which like reference numerals are used to identify the same or similar parts.

Figure 1B:
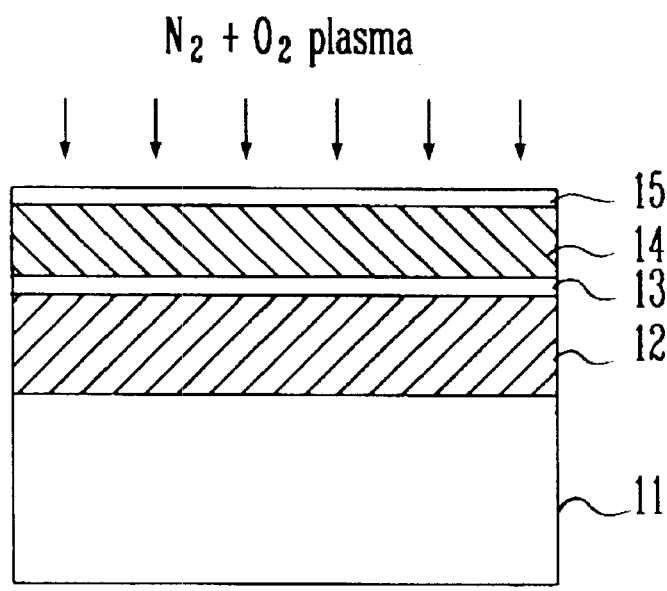
Figure 1C:
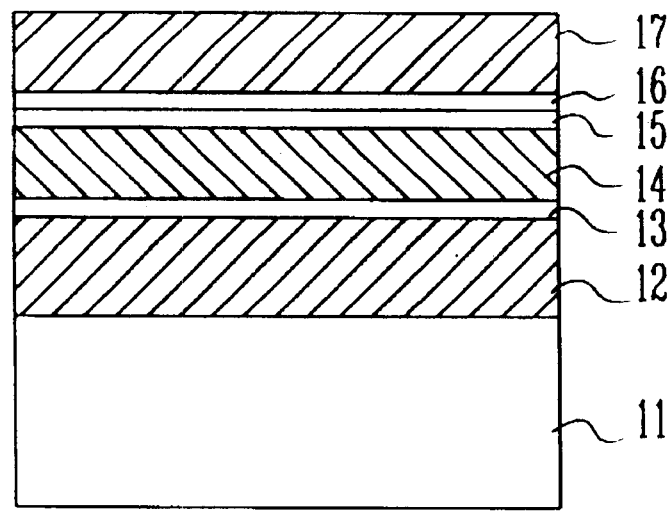

FIGS. 1A through 1C are sectional views of a device for illustrating a method of manufacturing a capacitor in a semiconductor device according to the present invention.

Referring now to FIG. 1A, a gate, a source, a drain and a bit line are formed by a given process, and a polysilicon film 12 is formed on a semiconductor substrate 11 in which an inter-layer insulating film for separating them from an upper layer is formed. Though only the capacitor has been shown in the drawing, for convenience, the polysilicon film 12 is a polysilicon plug, after the selected region of the inter-layer insulting film is etched to form a contact hole, buries the results. A first TiN film 13 is formed on the polysilicon 12. Then, a metal layer 14 is formed on the first TiN film 13, thus forming a lower electrode. The metal layer 14 may use a W film, a WN film, a TiN film etc. The first TiN film 13 serves as a buffer layer for preventing diffusion of the polysilicon film 12 and the metal layer 14 and for reducing a contact resistance, and is formed 100~200 angstrom in thickness. In case that the W film is used as the metal layer 14, the first TiN film is formed 400~600 angstrom in thickness. In order to remove impurities contained within the W film and lower the contact resistance of the lower electrode, the first TiN film is subjected to an annealing process under nitrogen atmosphere at 600° C. At this time, WO$_3$ to be formed in the W film is removed by HF.

Referring to FIG. 1B shows a sectional view of a state in which the Ta$_2$O$_5$ film 15 as a dielectric film is formed on the metal layer 14. The Ta$_2$O$_5$ film 15 can be deposited in two steps: firstly depositing 75~110 angstrom in thickness and after performing a plasma process in in-situ, secondly depositing 75~110 angstrom in thickness again, thus resulting in the thickness of 150~220 angstrom in total. The in-situ plasma process is performed under the atmosphere having a mixture gas of nitrogen and oxygen. The ratio of the nitrogen and the oxygen gases is preferably 4:1~1:1. At this time, the plasma process is performed with the power of 50~100 watt. Thereafter, a subsequent process is performed. The subsequent process may include an ex-situ plasma process, a low temperature annealing process of less than 400° C. with $UV/O_3$ etc., a rapid annealing process or a high temperature annealing process high than 600° C.

FIG. 1C is a sectional view of a state in which a second TiN film 16 and an upper electrode 17 are formed on the $Ta_2O_5$ film 15. The upper electrode 17 uses the polysilicon film or the metal layer.

Figure 2:
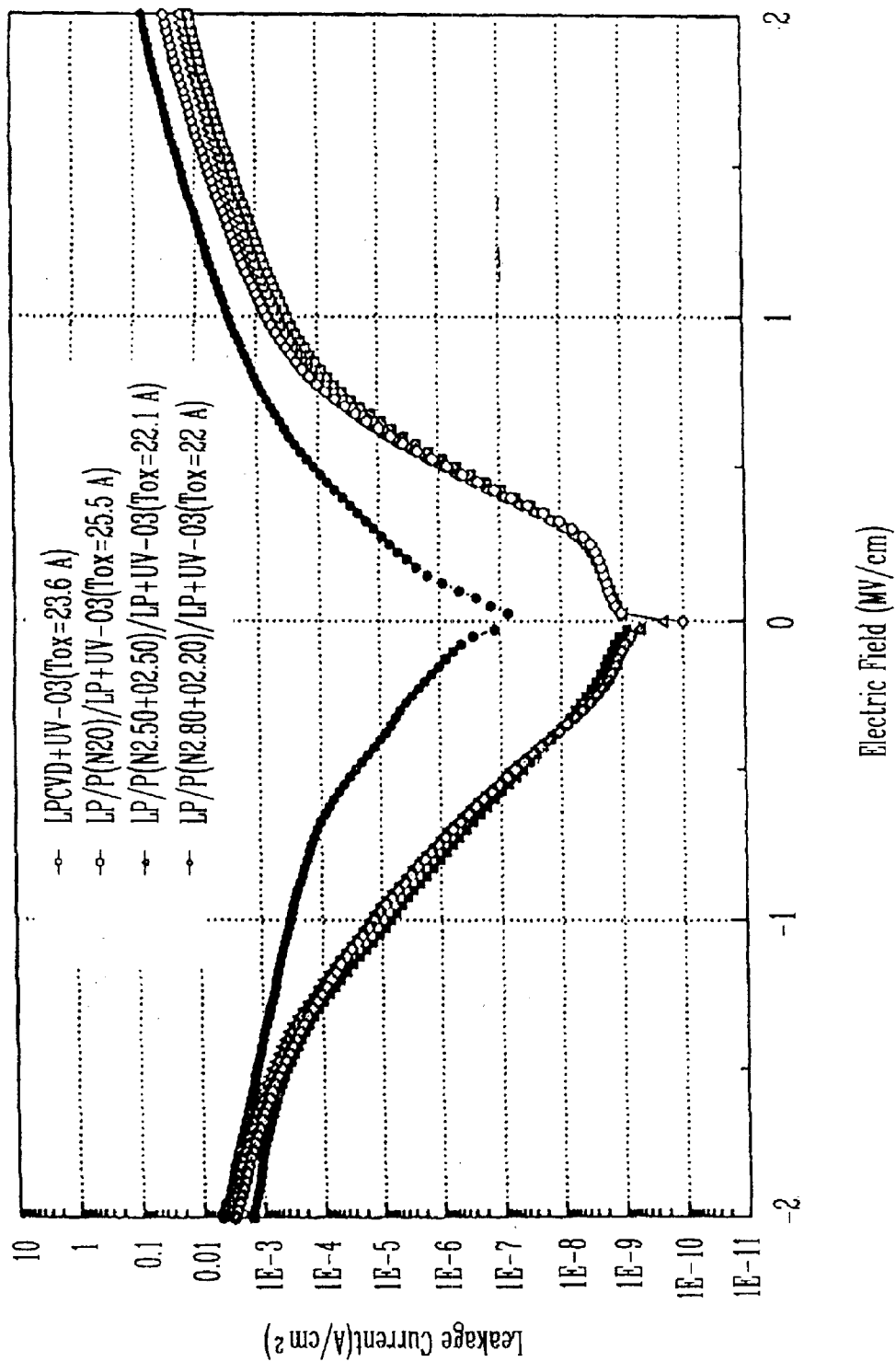
FIG. 2 shows a graph for comparing the equivalent oxide film thickness and the leak current according to the method of depositing a Ta$_2$O$_5$ film.

FIG. 2 shows a graph for comparing the equivalent oxide film thickness and the leak current according to the method of depositing the $Ta_2O_5$ film. It can be seen that the leak current could be more reduced by performing a plasma process than depositing the $Ta_2O_5$ film by means of LPCVD method. Also, it can be seen that the thickness of the equivalent oxide film was not more increased by using the mixture gas of nitrogen and oxygen, than using $N_2O$ gas. Therefore, as the thickness of the equivalent oxide film is not increased because the underlying metal electrode is prohibited from being oxidized by the mixture gas of nitrogen and oxygen, it can obtain a high capacitance.

As can be understood from the above description, the present invention can effectively remove the organic impurity of the $Ta_2O_5$ film by performing an in-situ plasma process using the mixture gas of nitrogen and oxygen during the process of forming the $Ta_2O_5$ film as the dielectric film of the capacitor. Therefore, it can reduce the impurity of the $Ta_2O_5$ film to increase the supply of oxygen, and thus improve the dielectric and leak current characteristic of the $Ta_2O_5$ film. Further, it can prohibit oxidization of the underlying electrode, thus reducing the thickness of the equivalent oxide film of the capacitor as possible and sufficiently securing the capacitance of the capacitor.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a capacitor in a semiconductor device, comprising the steps of:
   forming a polysilicon film on a semiconductor substrate in which a given underlying structure is formed;
   sequentially forming a first buffer layer and a metal layer on said polysilicon film to form a lower electrode;
   forming a first $Ta_2O_5$ film on said metal layer;
   performing a plasma process under a mixture gas atmosphere of nitrogen and oxygen in-situ to reduce impurities in said first $Ta_2O_5$ film;
   forming a second $Ta_2O_5$ film on said first $Ta_2O_5$ film; and
   sequentially forming a second buffer layer and an upper electrode on said second $Ta_2O_5$ film.

2. The method of manufacturing a capacitor in a semiconductor device according to claim 1, wherein said first buffer layer is a TiN film.

3. The method of manufacturing a capacitor in a semiconductor device according to claim 2, wherein the TiN film is formed in a thickness of 100 through 200 angstroms.

4. The method of manufacturing a capacitor in a semiconductor device according to claim 1, wherein said metal layer is any one of a W film, a WN film and a TiN film.

5. The method of manufacturing a capacitor in a semiconductor device according to claim 4, wherein said W film is formed in a thickness of 400 through 600 angstroms.

6. The method of manufacturing a capacitor in a semiconductor device according to claim 1, wherein the first $Ta_2O_5$ film is formed in a thickness of 75 through 110 angstroms.

7. The method of manufacturing a capacitor in a semiconductor device according to claim 1, wherein the second $Ta_2O_5$ film is formed in a thickness of 75 through 110 angstroms.

8. The method of manufacturing a capacitor in a semiconductor device according to claim 1, wherein said first and second $Ta_2O_5$ films together have a combined thickness of 150 through 220 angstroms.

9. The method of manufacturing a capacitor in a semiconductor device according to claim 1, wherein a ratio of said nitrogen and said oxygen gases is 4:1 through 1:1.

10. The method of manufacturing a capacitor in a semiconductor device according to claim 1, wherein said plasma process is performed at an electrical power of 50 through 22 watts.

11. The method of manufacturing a capacitor in a semiconductor device according to claim 1, wherein said second buffer layer is a TiN film.

12. A method of manufacturing a capacitor in a semiconductor device, comprising the steps of:
   forming a polysilicon film on a semiconductor substrate in which a given underlying structure is formed;
   forming a first TiN film on the polysilicon film, and a first metal layer on the first TiN film, to thereby form a lower electrode;
   forming a first $Ta_2O_5$ film on said lower electrode;
   performing an in-situ plasma process on said first $Ta_2O_5$ film, under a gas mixture of nitrogen and oxygen;
   forming a second $Ta_2O_5$ film on said first $Ta_2O_5$ film;
   forming a second buffer layer comprising a second TiN film on said second $Ta_2O_5$ film; and
   forming an upper electrode above said second TiN film.

13. The method of manufacturing a capacitor in a semiconductor device according to claim 12, wherein the first TiN film is formed in a thickness of 100 through 200 angstroms.

14. The method of manufacturing a capacitor in a semiconductor device according to claim 13, wherein said first metal layer is a W film formed in a thickness of 400 through 600 angstroms.

15. The method of manufacturing a capacitor in a semiconductor device according to claim 12, where the first $Ta_2O_5$ film is formed in a thickness of 75 through 110 angstroms, and the second $Ta_2O_5$ film is formed in a thickness of 75 through 110 angstroms.

16. The method of manufacturing a capacitor in a semiconductor device according to claim 12, wherein a ratio of said nitrogen and said oxygen gases is 4:1 through 1:1.

17. The method of manufacturing a capacitor in a semiconductor device according to claim 12, wherein said plasma process is performed at an electrical power of 50 through 22 watts.

* * * * *